United States Patent [19]

Marui et al.

[11] Patent Number: 5,309,372
[45] Date of Patent: May 3, 1994

[54] SYSTEM AND METHOD FOR DETERMINING ROUTES BETWEEN CIRCUIT BLOCKS OF A PROGRAMMABLE LOGIC DEVICE BY DETERMINING A LOAD PIN WHICH IS CLOSEST TO THE CENTER OF GRAVITY OF A PLURALITY OF LOAD PINS

[75] Inventors: Tomohiro Marui; Hideyo Funatsu, both of Chiba, Japan

[73] Assignee: Kawasaki Steel Corp., Hyogo, Japan

[21] Appl. No.: 552,517

[22] Filed: Jul. 16, 1990

[30] Foreign Application Priority Data

Jul. 17, 1989 [JP] Japan .................. 1-183992
Aug. 9, 1989 [JP] Japan .................. 1-206570

[51] Int. Cl.⁵ .............................. G06F 15/60
[52] U.S. Cl. .................... 364/491; 364/488; 364/DIG. 2; 364/917.96; 395/800
[58] Field of Search ............ 364/DIG. 1, DIG. 2, 364/488, 489, 490, 491, 148; 395/800

[56] References Cited

U.S. PATENT DOCUMENTS

| 3,681,782 | 8/1972 | Scanlon | 364/491 |
| 4,495,559 | 1/1985 | Gelatt, Jr. et al. | 364/148 |
| 4,582,015 | 7/1989 | Doyle, Jr. | 364/491 |
| 4,636,965 | 1/1987 | Smith et al. | 364/491 |
| 4,752,887 | 6/1988 | Kuwahara | 364/491 |
| 4,777,606 | 10/1988 | Fournier | 364/491 |
| 5,113,352 | 5/1992 | Finnerty | 364/489 |
| 5,128,871 | 7/1992 | Schmitz | 364/489 |

FOREIGN PATENT DOCUMENTS 63-155740 6/1988 Japan .
63-314846 12/1988 Japan .
1-114050 5/1989 Japan .

OTHER PUBLICATIONS

"Designing With Logic Cell Arrays", Pardner Wynn, U.S. Conference Record, 13/4, Xilinx, Inc., pp. 1-9 and 13, 1987.
"Locusroute: A Parallel Global Router For Standard Cells", Jonathan Rose, Computer Systems Laboratory Paper 14.3, 25th ACM/IEEE Design Automation Conference, pp. 189-195, 1988.

Primary Examiner—Thomas C. Lee
Assistant Examiner—John C. Loomis
Attorney, Agent, or Firm—Oliff & Berridge

[57] ABSTRACT

A system and method for automatically and optimally determining a route to be wired in a Programmable Logic Device (PLD) are disclosed in which a plurality of load pins to be wired with a source pin are selected sequentially according to a shortest length of distance from the source pin to the respective load pins, a plurality of switching stations present midway through each route of paths are selected on the basis of coordinates of a center of gravity derived from the coordinates of the unwired load pins and distances to the respective load pins to be wired sequentially, and, thus, a line network constituted by the routes of the first and second paths is formed. Furthermore, the route is corrected by searching out any of problematic switching stations through which the path cannot be formed from among the switching stations present along the route so as to bypass the problematic switching station. If this correction proves impossible, a second correction is sought by searching the problematic switching station itself so as to bypass a wired path present within the problematic switching station. If this correction also fails, a third mode of correction is implemented in which a switching station adjacent the problematic switching station is utilized.

5 Claims, 16 Drawing Sheets

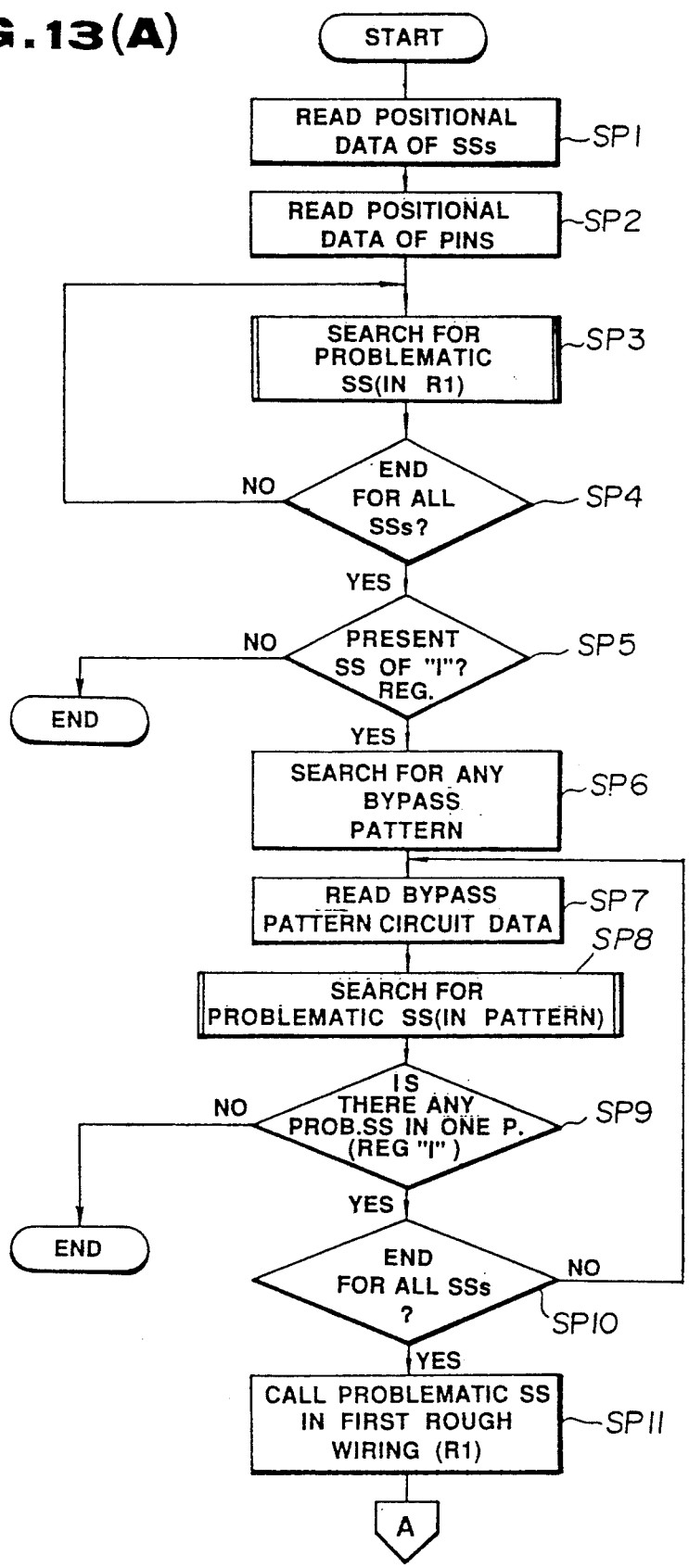

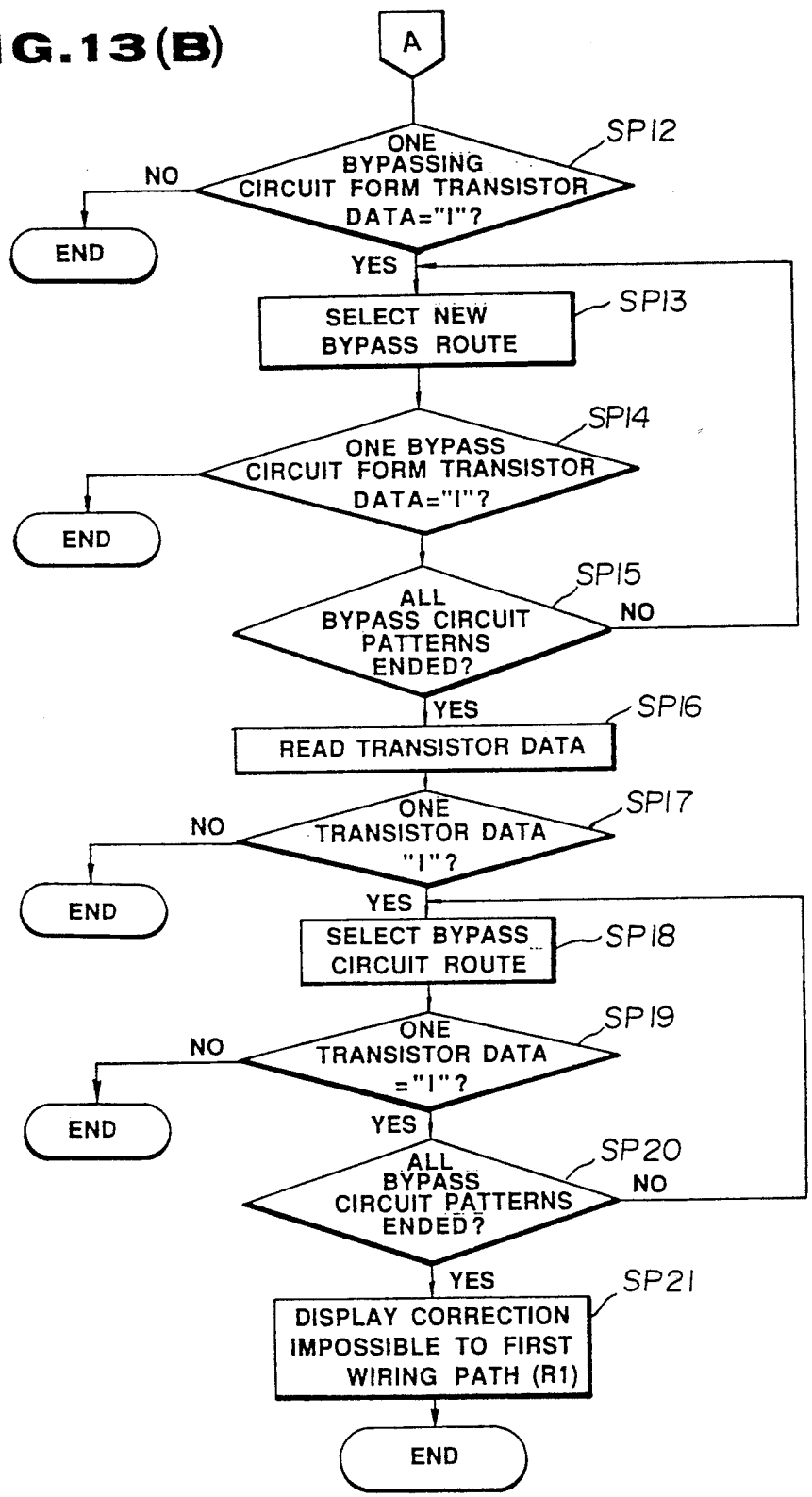

X --- PROBLEMATIC SS

SYSTEM AND METHOD FOR DETERMINING ROUTES BETWEEN CIRCUIT BLOCKS OF A PROGRAMMABLE LOGIC DEVICE BY DETERMINING A LOAD PIN WHICH IS CLOSEST TO THE CENTER OF GRAVITY OF A PLURALITY OF LOAD PINS

BACKGROUND OF THE INVENTION (1) Field of the Invention

The present invention relates to a system and method for automatically and optimally determining routes intervened between circuits (circuit blocks) of Programmable Logic Device (PLD). The present invention, particularly, relates to a system and method for automatically and optimally determining routes between circuits of the PLD in which connections between respective circuit blocks can be made with the shortest possible path with the least number of switching stations between the respective circuit blocks, and, which can effectively be formed using CAD (Computer Aided Design) system in a shorter length of time.

(2) Background of the Art

When Programmable Logic Devices (PLDs) or Logic Cell Arrays (LCAs) are designed for particular uses, it is necessary to determine paths of wiring to interconnect between internal circuit blocks so as to achieve logic circuitry required for a particular use.

For example, in Programmable Logic Devices (PLDs), a plurality of circuit blocks into which logic circuits are incorporated and a plurality of switching stations provided for determining the routes between the respective circuit blocks are regularly arranged in horizontal or vertical array forms.

In addition, a predetermined switching element within each switching station is turned on or off to define the path through the switching station hereinafter, generally referred to as an SS. It will further be noted that generally route will refer to the overall line network sought to be established among the circuit blocks and path will describe one aspect or segment of the total route). Therefore, a signal transmission line between a source pin of one of the circuit blocks and load pin of one of the other circuit blocks is formed to provide a required logic circuitry between each circuit block.

In more detail, each switching station SS, as shown in FIGS. 1 and 2, is provided with a plurality of electrically conductive pins located on four sides thereof, i.e., the N (North) side, S (South) side, W (West) side, and E (East) side, these pins being used to input or output information signals. These conductive pins extended on each side of the switching station SS are connected to those on adjacent switching stations. As shown in FIG. 3, a switching element such as a MOS (Metal Oxide Semiconductor) transistor T is interposed between the associated pins. When the transistor T is turned on, a single path is established between the associated pins so as to enable electrical connection between the pins.

When, e.g., a data of "1" is set in a storage area of SRAM (Static Random Access Memory) connected to a gate of the MOS transistor T, the MOS transistor T is turned on to electrically connect both pins. Between which pins the MOS transistor T is interposed depends on specifications prepared for the switching stations. For example, the plurality of MOS transistors may be installed to respective pins according to such specifications as shown in FIGS. 4 (A) to 4 (M).

As appreciated from FIG. 4 (A), a current path can be established between pins W1 and E1 if the MOS transistor TW1E1 (shown in FIG. 4 (A)) is turned on. Consequently, it is possible to set the connections within respective switching stations according to the user's requirement. Thus, the paths according to the user's requirements can be carried out between a circuit block and an adjacent switching station and between mutually adjoining switching stations.

As described above, a single connection between the circuit blocks to be interconnected can be formed.

A method of determining paths in the PLDs includes, a first, rough determination of the route through a rough selection of SSs, i.e., through which of SSs the wired line between the source pin on one of the circuit blocks and load pin on one of the other circuit blocks is to be passed and a main determination which of the switching transistors within the selected SSs are to be turned on or off.

In order to facilitate the rough determination of path, various types of apparatuses for computer aided design (CAD) have been developed.

The rough determination of paths includes a 1:1 path, i.e., a line wired from a single source pin S to a single load pin L and 1:MULTI (a multiple number of lines), i.e., a single source pin to a plurality of load pins.

A Japanese Patent Application First Publication (unexamined) Showa 63-155740 published on Jun. 28, 1988 exemplifies a wiring method in which the route between a single source pin and a single load pin, or 1:1 wiring, is disclosed.

On the other hand, in the method of 1 (source pin S):MULTI (the multiple number of load pins), particular load pins from among the plurality of load pins are sequentially specified by a user and the required connections are formed such that the required number of load pins are wired to the source to provide the 1:MULTI required by the user.

However, in the above-described method of sequentially specifying a particular load pin from among the plurality of load pins when forming the paths between the respective source pins and load pins, i.e., a 1:MULTI type connection, a total length of each finally determined path becomes long and, thereby, a delay time, i.e., propagation delay of signals of the associated logic circuitry, becomes excessively long so as to reduce an efficiency of the logic circuitry.

Japanese Patent Application First Publications (unexamined) Showa 63-314846 published on Dec. 22, 1988 and Heisei 1-114050 published on May 2, 1989 exemplify a previously proposed method of automatically determining the above-described rough paths utilizing CAD.

In the previously proposed automatic rough route determination methods disclosed in the two above-identified Japanese Patent Application First Publications, to suppress generation of delay time involved in signal propagations between the circuit blocks in the LSI, the shortest paths between the associated blocks to be interconnected are automatically designed without intersections with other wired lines of paths when the circuit blocks to be interconnected are specified by the user.

As shown in FIG. 1, suppose that the circuit blocks to be interconnected B1 and B2 and the user specifies these two blocks B1 and B2 to be interconnected toward the CAD system. The automatic rough path determining method in the system can determine one of the plurality of paths to be taken between B1 and B2, i.e., R1 shown in FIG. 1.

According to the previously proposed apparatuses for automatically determining the rough paths between circuit blocks, a time required to design of the shortest paths can be shortened, as compared with the manual design counterpart, to provide the shortest paths.

However, because of restrictions placed on combinations of paths possible within the switching stations in the PLDs, when a plurality of the combinations of lines between two circuit blocks to be interconnected are present if connection combinations are plurally present and some of paths cannot be determined after the rough path determinations are completed.

That is to say, after the rough path determinations, the main path determinations which select which one of transistors within each SS disposed along the path will be turned on in order to achieve the shortest path.

During the main path determination, to prevent the delay time from increasing within the switching stations present midway along the rough path, it is common practice to form the path as short as possible along a given direction within the respective switching stations.

For example, to effect the shortest route R1 within the switching station SS2, of FIG. 1, the transistors (according to FIG. 4) TW1E1, TW2E2, and TW3E3 are the transistors to be turned on. It will be noted that all the transistors shown in FIG. 4 are present in each switching station SS.

For example, since the route R1 denoted by a solid line on the switching station SS3 and another route R2 denoted by a broken line are to be formed (the other path of R2 serves to connect associated circuit blocks other than B1-B2 of FIG. 1), the transistor TW1N1 is turned on to provide a path between the pins N1-W1 of the switch station SS3. The route from the pin W1 to the pin E1 cannot be simultaneously used by as two routes. If the same occurs in other routes from W2 to E2 or from W3 to E3, as shown in FIGS. 4 (B) and 4 (C), it will not possible to establish the path R1 within SS 3, for example.

Then, if the rough path determinations are continued neglecting the above described conditions, the path determination becomes often impossible if the path determination is carried out after determination of all the rough paths. At this time, it becomes necessary to restart the rough path determinations. This wastefully consumes time as far as design considerations are concerned.

Then, if it is necessary to correct the shortest route R1 by bypassing a problematic switching station SS (SS3, for example, the term problematic switching station will be defined in detail in the DETAILED DESCRIPTION OF THE PREFERRED EMBODIMENTS), such bypassing is carried out according to no fixed rules, so the total length of the paths become large so that an increase in delay time duration becomes detrimental to the overall design.

SUMMARY OF THE INVENTION

It is an object of the present invention to provide a system and method for automatically and optimally determining connections between circuit blocks in PLDs in which one circuit block can be interconnected to a plurality of other circuit blocks via a shortest route so as to keep delay times generated on the route to a minimum and correction of rough path determinations can automatically be carried out for each rough path determination so that a time required to design a route configuration in the PLD circuit can be shortened.

The above-described object can be achieved by providing a system for automatically and optimally determining a route to be wired in a large scale integrated circuit (LSI), comprising: a) a plurality of circuit blocks, each circuit block having a plurality of terminal pins extended along respective sides thereof; b) a plurality of switching stations, each switching station having a plurality of terminal pins extended along respective sides thereof for providing connecting means between the respective pins so as to propagate the route; c) a single source pin selected from any one pine of one of the circuit blocks and a plurality of load pins defined from any other terminal pins of any other circuit blocks required to be connected to the source pin, wherein said system for automatically and optimally determining a route to be wired comprises: d) first means for selecting a first load pin to be established via a first path based on determining which of the load pins is a shortest distance from the source pin, and when a plurality of load pins are an equally short distance from the source pin, selecting the first load pin based on determining which of the load pins is a shortest distance from a first position on a first center of gravity determined relative the plurality of load pins to be wired, said first center of gravity being determined excluding the load pins closest to the source pin; e) second means for forming a first path from the source pin to the first load pin, the first path including at least one switching station at a position which is a shortest distance from the first load pin and from a second center of gravity determined from the positions of the unwired load pins excluding the first load pin; f) third means for selecting a second load pin to be wired second from among the plurality of load pins other than the first load pin based on determining which of the load pins other than the first load pin is a shortest distance from any one of the switching stations present on the first path; g) fourth means for forming a second path branched from the first path so as to extend the route, the second path including at least one switching station selected at a position which is a shortest distance from the second load pin and from a third center of gravity determined from the positions of the unwired load pins excluding the first and second load pins; and h) fifth means for continuously forming a plurality of paths branched from the established first and second paths to complete a line network extended from the source pin to the plurality of load pins until all of the unwired load pins are wired to the line network via the switching stations adjacent to the respective load pins.

The above-described object can also be achieved by providing a method for automatically and optimally determining a route to be established in a large scale integrated circuit (LSI), comprising: a) providing a plurality of circuit blocks, each circuit block having a plurality of terminal pins extended along respective sides thereof; b) providing a plurality of switching stations, each switching station having a plurality of terminal pins extended along respective sides thereof for providing connecting means between the respective pins so as to propagate the route; c) defining a source pin of any one of the circuit blocks from which the route is started and a plurality of load pins of any other circuit blocks which will be connected to the source pin via the route according to a given application specified for the LSI and forming a first path from the source pin to a first one of the load pins to be established first from among the plurality of load pins, the first means selecting the first load pin to be established via the first path on the basis of a result of determination of which of the load pins is a shortest distance from a first position of a center of gravity derived relative the plurality of load pins excluding the first load pin; d) selecting a second one of the load pins to be wired second from among the plurality of load pins other than the first load pin, selecting the second load pin on the basis of a result of determination of which of the load pins other than the first load pin is a shortest distance from any one of the switching stations present in the first path; e) selecting at least one of the switching stations which is present along the first path and which is placed at a position having a shortest distance to the second load pin selected in the step d) and forming a second path branched from the first path so as to extend the route of path, the second path having the selected switching station which is placed at a position having a shortest distance to a second center of gravity determined relative the positions of the unwired load pins other than the first and second load pins; and f) continuously forming a plurality of paths branched from the first paths to complete a line network extended from the source path to the plurality of load pins until all of the unwired load pins are wired to the line network via the switching stations adjacent to the respective load pins.

BRIEF DESCRIPTION OF THE DRAWINGS

FIGS. 13 (A) and 13 (B) are integrally an operational flowchart executed by the system in a second preferred embodiment according to the present invention.

DETAILED DESCRIPTION OF THE PREFERRED EMBODIMENTS

Reference will hereinafter be made to the drawings in order to facilitate a better understanding of the present invention.

(First Preferred Embodiment)

Figure 5:
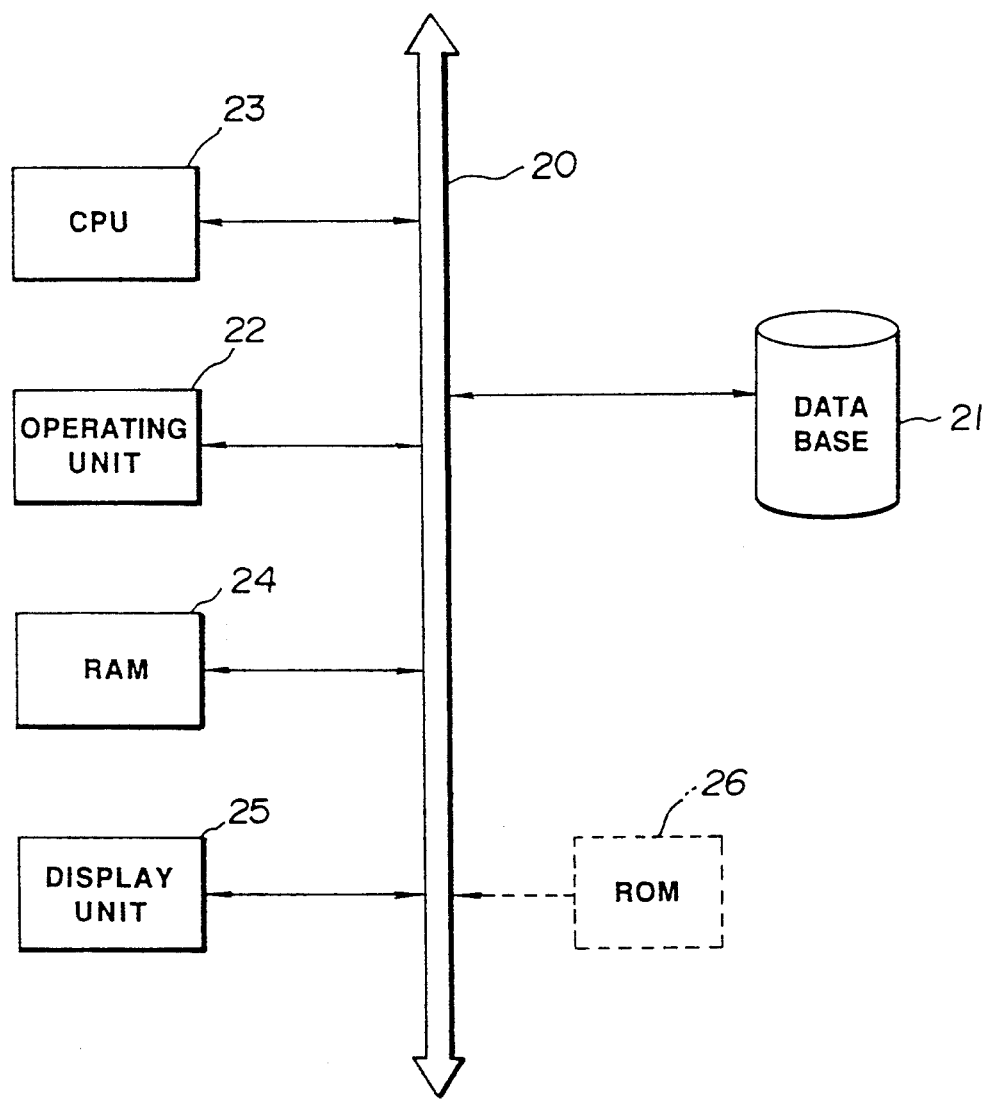
FIG. 5 is a system configuration of a system for automatically and optimally determining routes of paths between circuit blocks of a PLD.

FIG. 5 shows a simple embodiment of a system for automatically and optimally determining route of paths between circuit blocks of PLD.

In FIG. 5, a system bus 20 including a data bus and a control bus provides means for connecting all components, i.e., a CPU 23, an operating unit 22, RAM (Random Access Memory) 24, a Display Unit 25, and a Data Base 21 (ROM 26 inclusive). The Data Base (e.g., a magnetic disc or semiconductor) 21 stores coordinate data on respective source pins and load pins provided on all circuit blocks in a large scale integrated circuit (LSI) and coordinates data for all switching stations SS. The operating unit 22 includes, e.g., a keyboard and mouse.

The CPU (Central Processing Unit) 23 carries out calculations for determining the connection current path for 1:MULTI connections between a single source pin and a plurality of load pins by reading the contents of the Data Base 21. The RAM (Random Access Memory) 24 temporarily stores the processed data derived from the CPU 23. The Display Unit 25 including a CRT (Cathode Ray Tube) is capable of displaying circuit blocks, switching stations, and interconnection lines.

An operation of the automatic, optimal current path determining system according to a first preferred embodiment of the invention will be described with reference to FIGS. 6 through 12.

Figure 6A:
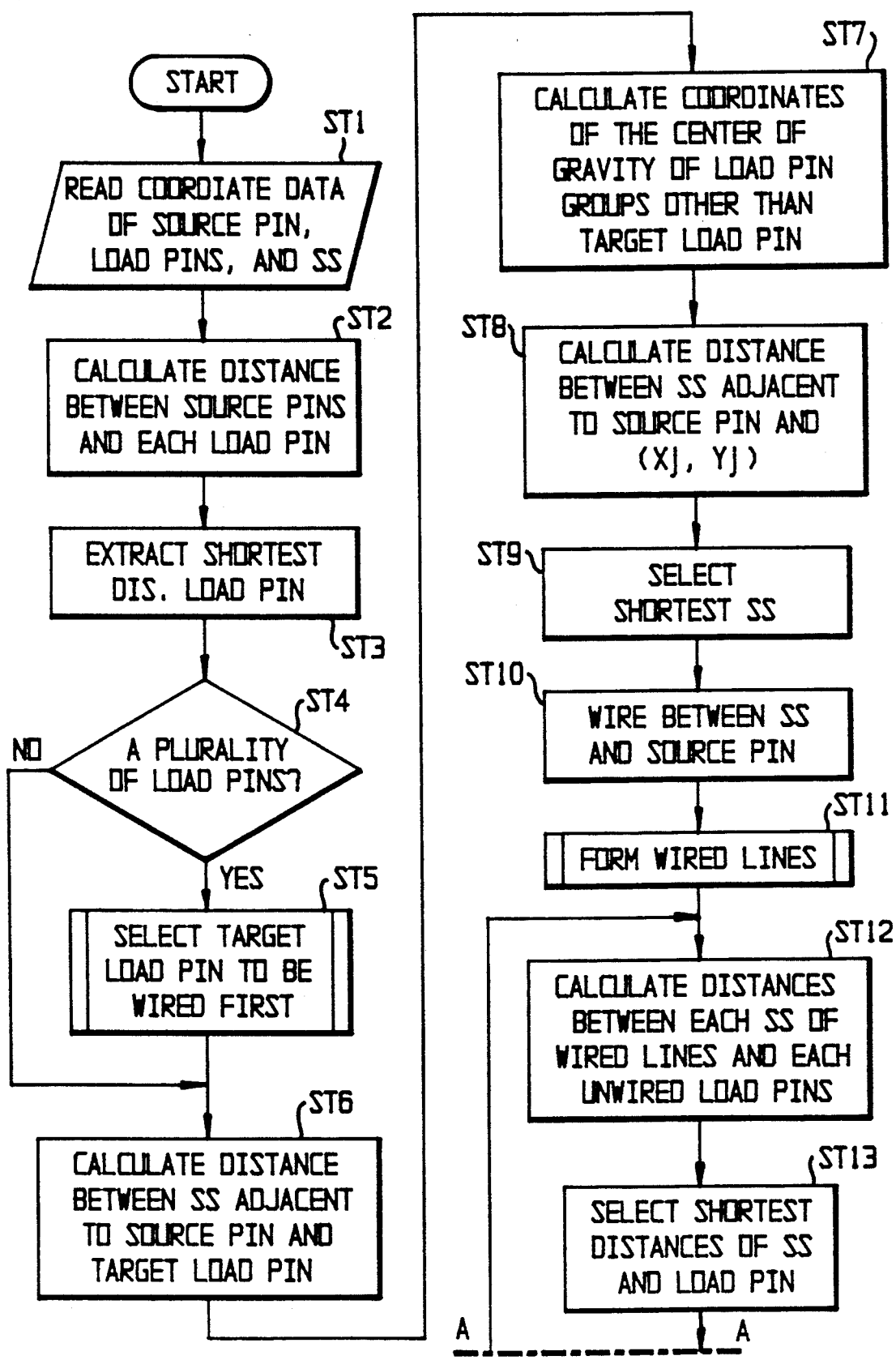
FIGS. 6(A) and 6(B) are an operational flowchart which is executed by the system in the first preferred embodiment shown in FIG. 5.
Figure 6B:
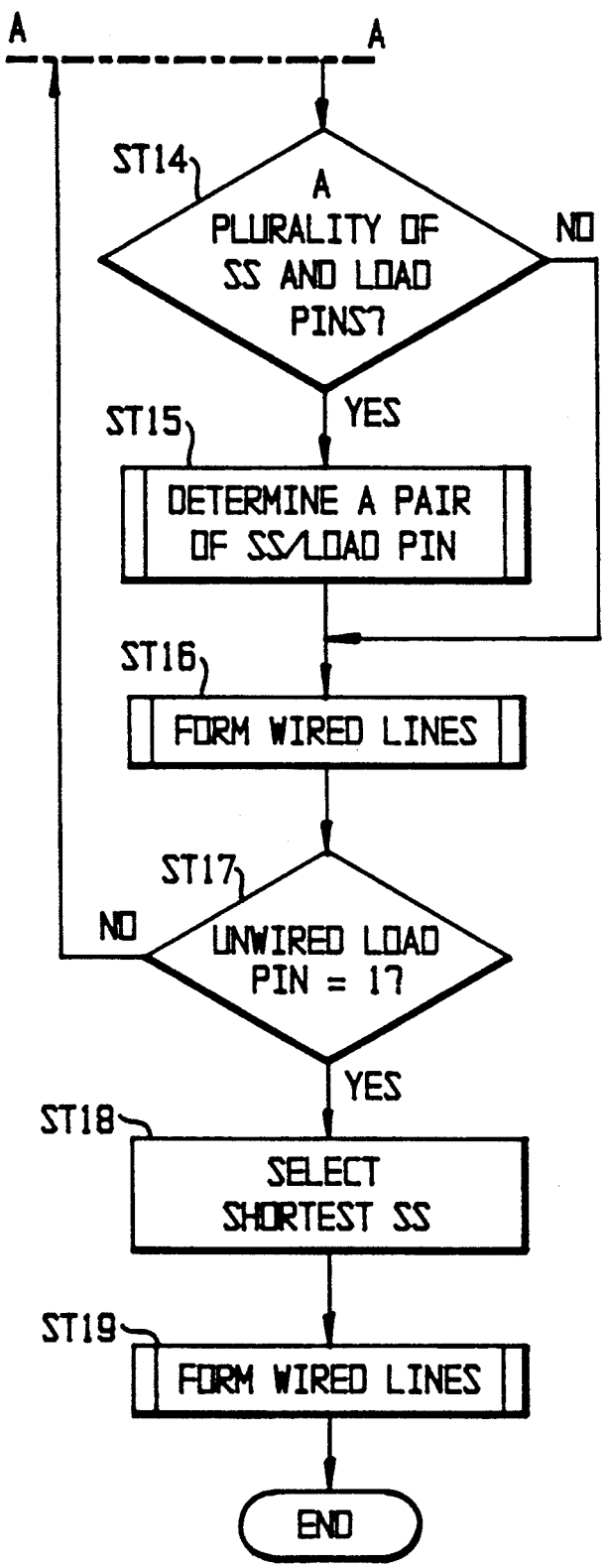

FIG. 6 shows a main program flowchart executed by the CPU 23 in the preferred embodiment.

In FIG. 6, the CPU 23 reads coordinate data (x, y) for all source and load pins to be interconnected from the Data Base 21 and also reads the coordinates of all switching stations SS therefrom. These coordinate data (x, y) are temporarily stored in the RAM 24.

FIGS. 7 (A) through 7 (G) show a series of routing patterns executed in the system step by step when building a line configuration from a single source pin S of a circuit block to a plurality of load pins of any other circuit blocks required to be interconnected to the source pin S.

In FIGS. 7 (A) through 7 (G), the symbol S denotes one source pin on one circuit block. L1 through L6 denote load pins on other respective circuit blocks to be wired to the source pin S, in a so-called, 1:MULTI pattern. In addition, symbol SS denotes a switching station. The SSs are arranged in a regular array around the source pins and load pins of the circuit blocks (refer to FIG. 1).

Figure 8:
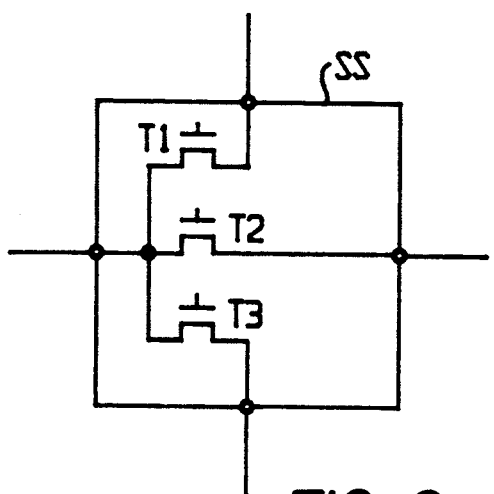
FIG. 8 is a schematic view of a structure of a representative switching station applicable to the first preferred embodiment.

The structure of each SS is representatively shown in FIG. 8. It is noted that although in FIGS. 4 (A) through 4 (M), the complete range of possible switching arrangements for each SS is pictured, FIG. 8 indicates only the relevant structures of each SS while omitting other detail for the sake of simplicity.

The switching station SS shown in FIG. 8 is provided with three transistors T1 to T3 which are properly turned on or off so that connections to adjacent switching stations SS in the X-axis or Y-axis direction can be formed in terms of the X-Y coordinate system.

In step ST1, the coordinate data for the source pins, load pins and SSs is read by the CPU as described previously.

In steps ST2 and ST3, the CPU 23 selects the source pin S and one of load pins (L1 through L6) to be wired first to the source pin S.

In detail, in the step ST2, the CPU 23 calculates distances from the source pin S to respective load pins L1 through L6. The series of calculations are executed on the basis of the equation below.

Suppose that the coordinates of the source pin S and load pins L are $(X_s, Y_s)$ and $(X_L, Y_L)$. Then, the following equation (1) is derived:

$$Distance = |X_L - X_S| + Y_L - Y_S \qquad (1)$$

In the step ST3, the CPU 23 determines the load pin having the shortest distance from the source pin S according to the above calculation.

Referring to FIG. 7 (A), the determined load pin is L1 which is then wired first to the source pin S.

It is noted that FIG. 7 (A) shows an image displayed on a CRT screen, when the CPU 23 reads the coordinate data of the source pins and load pins from the Data Base 21, it operates to display the source pin and load pins before displaying the path.

The reason for wiring the load pin the shortest distance from the source pin S first from among the plurality of load pins is that forming a current path from a source pin S to consecutive load pins with the shortest distance permits the total length of the path to be shorter, viewed as a final distributed line network.

It will be noted that in some cases it may be necessary to determine a first load pin to be wired from among a plurality of load pins which are equally distant from the source pin.

In the step ST4, if the number of load pins having the shortest distance is 1 (NO), the routine goes to a step ST6 in which a line is extended between the source pin S and the load pin to be wired first.

Referring to FIG. 7 (B), a line will be formed between the source pin S and load pin L1.

On the other hand, in a case where the number of the load pins having a shortest distance to the source is 2 or more (YES), the routine goes to a step ST5 in which the load pin to be wired first is selected from the plurality of load pins. In detail, when entering the step ST5, the routine goes to a subroutine shown in FIG. 9.

Figure 9:
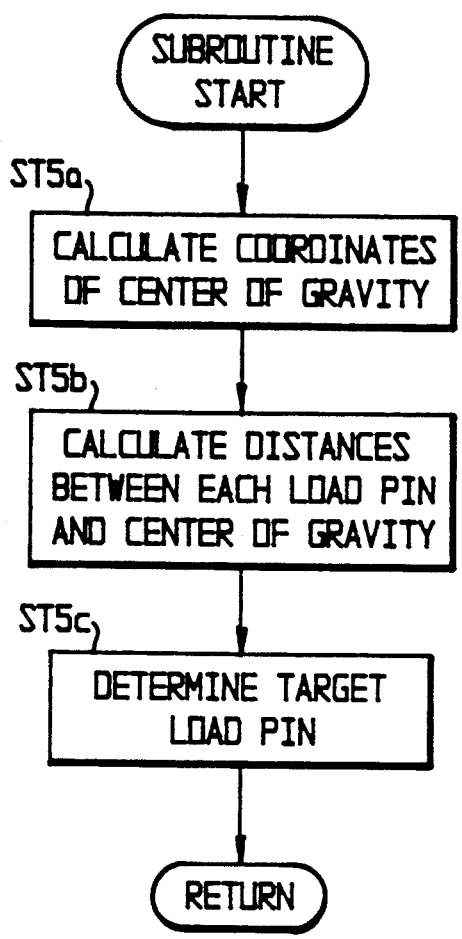
FIG. 9 is an operational flowchart of a subroutine of a step ST5 shown in FIG. 6.

In the subroutine shown in FIG. 9, the CPU 23 calculates barycentric coordinates (coordinates of a center of gravity) from the coordinate data of the respective load pins other than the plurality of load pins closest to the source pin as derived in the step ST4, in a step ST5a, and stores temporarily the barycentric coordinate data into the RAM 24.

In a step ST5b, the CPU 23 calculates the distance from each load pin derived in the step ST4 to the position of a center of gravity (barycentric coordinates) derived in the step ST5a. The calculation of distances executed in the step ST5b conform essentially to the equation (1). The results of the calculations are temporarily stored into the RAM 24.

Then, the subroutine goes to a step ST5c in which the CPU 23 determines whether a target load pin to be wired first with the source pin S gives a shortest distance to the center of gravity as derived in the step ST5b.

It is noted that the reason for setting the load pin which is nearest to the barycentric position as the target load pin is that setting the target load pin at a position nearest the barycentric position of the group of other load pins (previously stored in the RAM 24 in a step ST5a) brings out an overall shortening of the lines as finally wired.

It will be noted that in a case where an one of the present load pins is previously specified on a priority order as may by set by a user, that load pin is selected to be wired first.

Next, in a step ST6 of FIG. 6, the CPU 23 calculates the distances to the determined target load pin L1 from the respective switching stations SS 1 to SS 4 (refer to FIG. 7 (A)) located around the source pin S.

In a step ST7, the CPU 23 calculates the barycentric coordinates J $(X_j, y_j)$ of the load pins L2 through L6 other than the target load pin L1 and temporarily stores the barycentric coordinate data J $(x_j, y_j)$ into the RAM 24.

In a step ST8, the CPU 23 calculates a distance between the coordinates of the target load pin L1 and barycentric coordinate data J $(x_j, y_j)$.

In a step ST9, the CPU 23 selects one of the switching stations, i.e., SS1 which is a shortest distance from the position of the target load pin (L1), determined in the step ST6, and which is also shortest distance from the position of the center of gravity J in the step ST7. In other words, two distance criterion must be satisfied by the selected SS.

In a step ST10, the CPU 23 issues a command to wire the source pin S to SS1, as shown in FIG. 7 (B).

In FIG. 7 (A), although both of switching stations SS1 and SS2 equally give the shortest distance to the target load pin L1, the switching station SS1 is nearer to the barycentric coordinates J than SS2. Therefore, the switching station SS1 is selected to form the line from the source pin S.

It is noted that, as with the load pins, the reason that the SS place nearer to the center of gravity J is selected is that a path formed at a position nearer to the center of gravity J brings about a shortening of the overall line structure.

In a step ST11, with mutual SSs wired sequentially, the CPU 23 completes the wired line between the source pin S and load pin L1.

Figure 10:
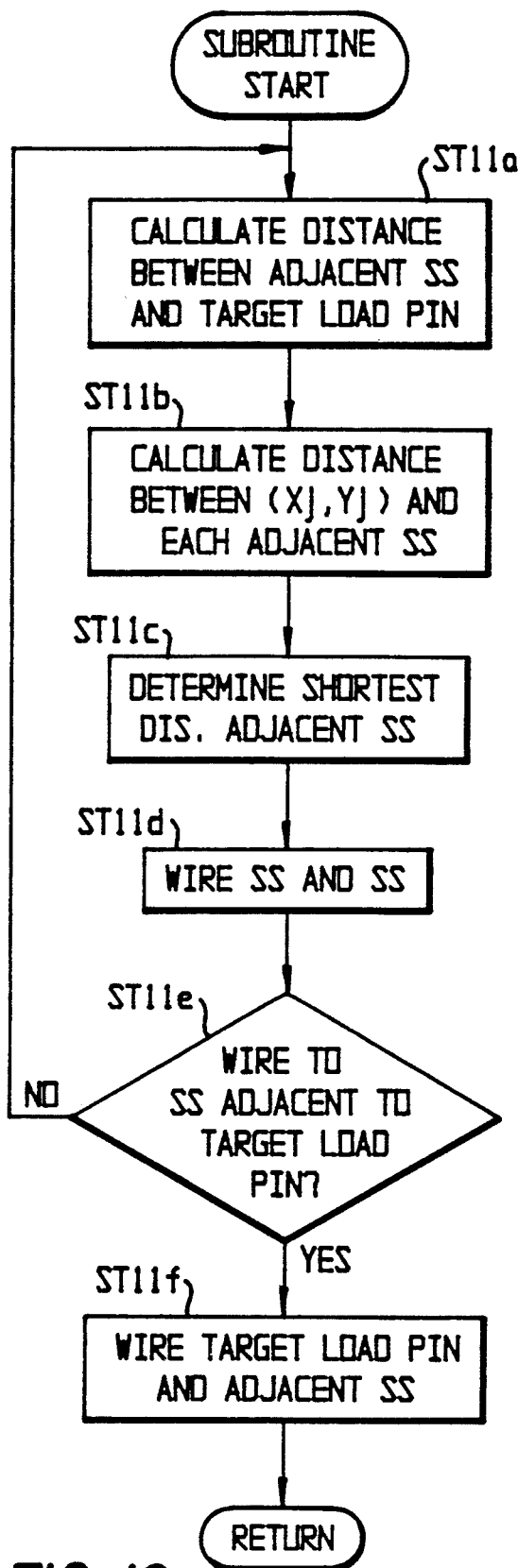
FIG. 10 is an operational flowchart of a subroutine of a step ST11 shown in FIG. 6.

The procedure executed in the step ST11 will be described below with reference to its subroutine as shown in FIG. 10.

In a step ST11a, the CPU 23 calculates the distances from the SSs adjacent to SS1 to the target load pin L1 in the same way as carried out in step ST6. The results of calculations are stored into the RAM 24. Furthermore, in a step ST 11b, the CPU 23 calculates the distances from respective SSs adjacent to SS1 to the barycentric coordinates J and the results of calculations are temporarily stored into the RAM 24.

In a step ST11c, the CPU 23 selects, as the next SS, the switching station SS placed closest to the target load pin L1 and to the center of gravity J according to the data temporarily stored in the RAM 24.

In FIG. 7, from among the switching stations SSs adjacent SS1, the SS meeting the above requirements is SS5.

It is noted that it is possible to shorten the wired line by selecting subsequent switching stations SS nearest the barycentric coordinates.

In a step ST 11d, the CPU 23 wires SS1 with SS5, as shown in FIG. 7 (B).

Figure 11:
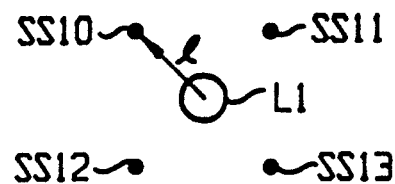
FIG. 11 is a schematic view of a path arrangement near a target load pin L1 and switching stations adjacent to the target load pin applicable to the first preferred embodiment.
Figure 7A:
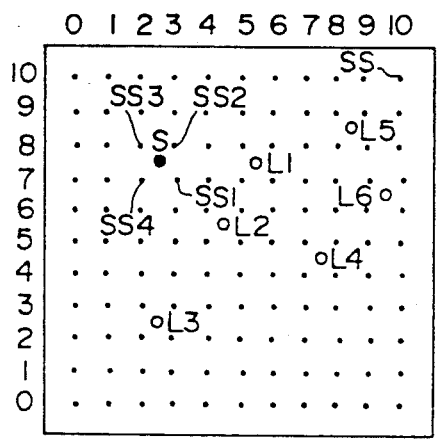
FIGS. 7 (A), 7(B), 7(C), 7(D), 7(E), 7(F), and 7 (G) are schematic views for explaining a series of patterns of paths displayed on a screen of a CRT shown in FIG. 5 applicable to the first preferred embodiment.
Figure 7B:
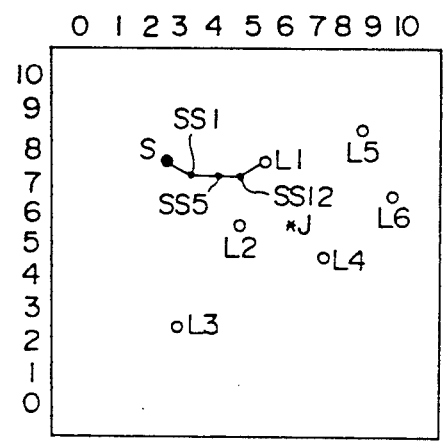
Figure 7C:
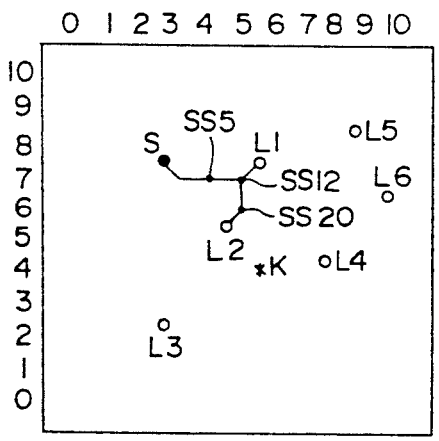
Figure 7D:
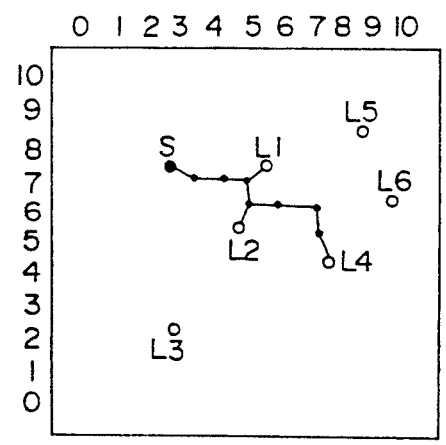
Figure 7E:
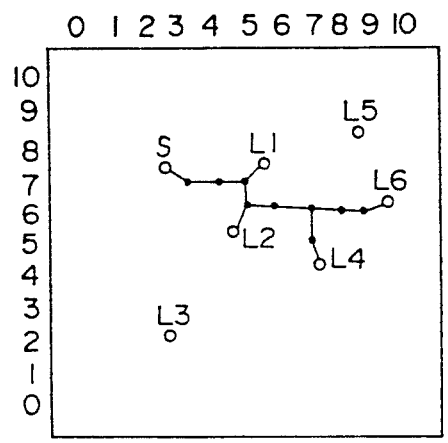
Figure 7F:
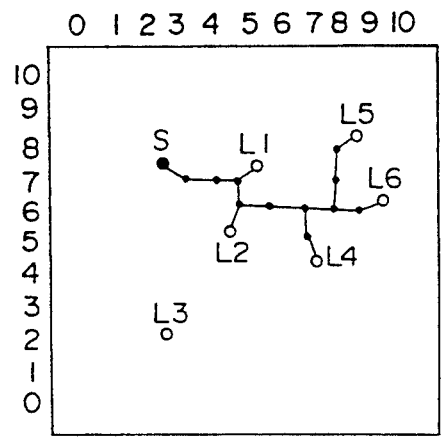
Figure 7G:
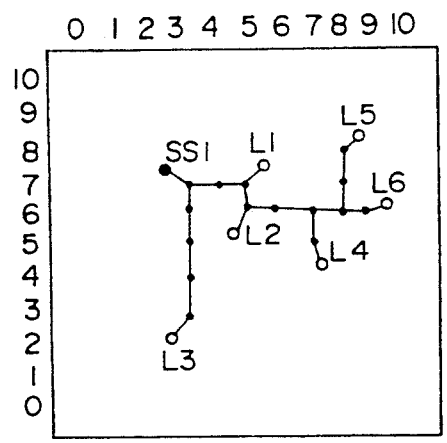

In a step ST11e, the CPU 23 determines whether the line has been formed as far as the switching stations SS adjacent to the load pin L1, i.e. SS10 to SS13, as shown in the enlarged view of FIG. 11.

In a case where the CPU 23 determines that the wire is not formed as far as an SS adjacent to the load pin L1, the routine returns to the step ST11a and repeats the processing of steps ST11a through ST11d until the current path is formed as far as an SS adjacent to the load pin L1.

At this point, calculation is carried out from the distance between SS coordinates placed at the present end of the connection line (coordinates of the SS currently placed at the top end of path) and the load pin L1, such that the CPU 23 determines whether the calculated distance to the load pin L1 is below of FIG. 11.

Consequently, the wire line of source pin S-SS1-SS-5-SS12 is formed as shown in FIG. 7 (B).

When the CPU 23 determines that the path is carried out to the switching station SS adjacent to the load pin L1 (SS12 in FIG. 11), the routine goes to the step ST11f in which the path is formed between a target load pin L1 and its adjacent switching station SS12, as shown in FIG. 7 (B). Upon completion of processing in the step ST11f, the routine returns to a step ST12 of the main routine of FIG. 6.

The step ST12 and its subsequent steps are a series of processings in which, from the line formed between the source pin S and load pin L1 in step ST11, new lines are extended to other load pins L2 through L6.

That is to say, in the step ST12, the CPU 23 calculates the distances from respective SSs (SS1, SS5, and SS12) present on the line and each remaining unwired load pin (L2 to L6). The results of calculations are temporarily stored into the RAM 24.

In a step ST13, the CPU 23 reads the results of calculations temporarily stored in the RAM 24 in the step ST12 to select the combination of switching stations SS and load pins which shows the shortest distance between one switching station and one load pin. The coordinate data of the selected SS and load pin are temporarily stored into the RAM 24.

In a step ST14, the CPU 23 determines whether there are a 2 or more combinations of switching stations SS and load pins having a shortest distance therebetween. If a single combination and load pin are present in the step ST14 (NO), the routine jumps to the step ST16 in which forming (extension) of the wired line is carried out.

On the other hand, if the CPU 23 determines that a plurality of combinations is present, the routine goes to a step ST15.

In this case, as shown in FIG. 7 (C), the switching stations SS which are closest to unwired load pins are SS5 and SS12, which are equally proximate to load pin L2.

In the step ST15, the CPU 23 selects one combination of a switching station SS and load pin from among the plurality of the SSs and load pins. Such processing is executed by the CPU 23 in a subroutine shown in FIG. 12, In a step ST15a, the barycentric coordinates of the groups of pins other than the load pins derived in ST13b are calculated and the coordinates are temporarily stored in the RAM 24.

In a step ST15b, the CPU 23 determines whether a plurality of load pins have equally short distances to SSs present along the connection line.

If, in the step ST15b, the CPU 23 determines that the number of load pins is one (NO) the routine jumps to the step ST15e in which the CPU 23 calculates distances from respective switching stations determined and selected in the step ST13 to the center of gravity derived in the step ST15a in accordance with the equation (1). In a step ST15f, the CPU selects a switching station SS having the shortest distance to the center of gravity.

On the other hand, if YES, in the step ST15b, the routine goes to a step ST15c.

Next, in a step ST15c, the CPU 23 calculates distances from respective load pins determined and selected in the step ST13 to the center of gravity derived in the step ST15c in accordance with the equation (1). The results of calculations are temporarily stored for each load pin into the RAM 24.

In a step ST15d, the CPU 23 selects the load pin having the shortest distance to the center of gravity from the results of calculations derived in the step ST15c. In a step ST15e, the CPU 23 calculates distances from respective switching stations determined and selected in the step ST13 to the center of gravity derived in the step ST15b in accordance with the equation (1). In a step ST15f, CPU 23 selects a the switching station SS having the shortest distance to the center of gravity, then the subroutine is ended and returned to the main routine of FIG. 6.

Referring to FIG. 7 (C), the load pin having the shortest distance to the switching stations present along the connection line is one, i.e., L2 and the switching stations SS present along the line having the shortest distance to the load pin L2 are two, i.e., SS5 and SS12. Since the switching station SS nearer to a center of gravity K for the load pins L3 through L6 (excluding load pin L2) is SS12, the CPU 23 selects the switching station SS12 rather than SS5 as the switching station SS to be connected to the load pin L2 in the step ST15f.

Figure 12:
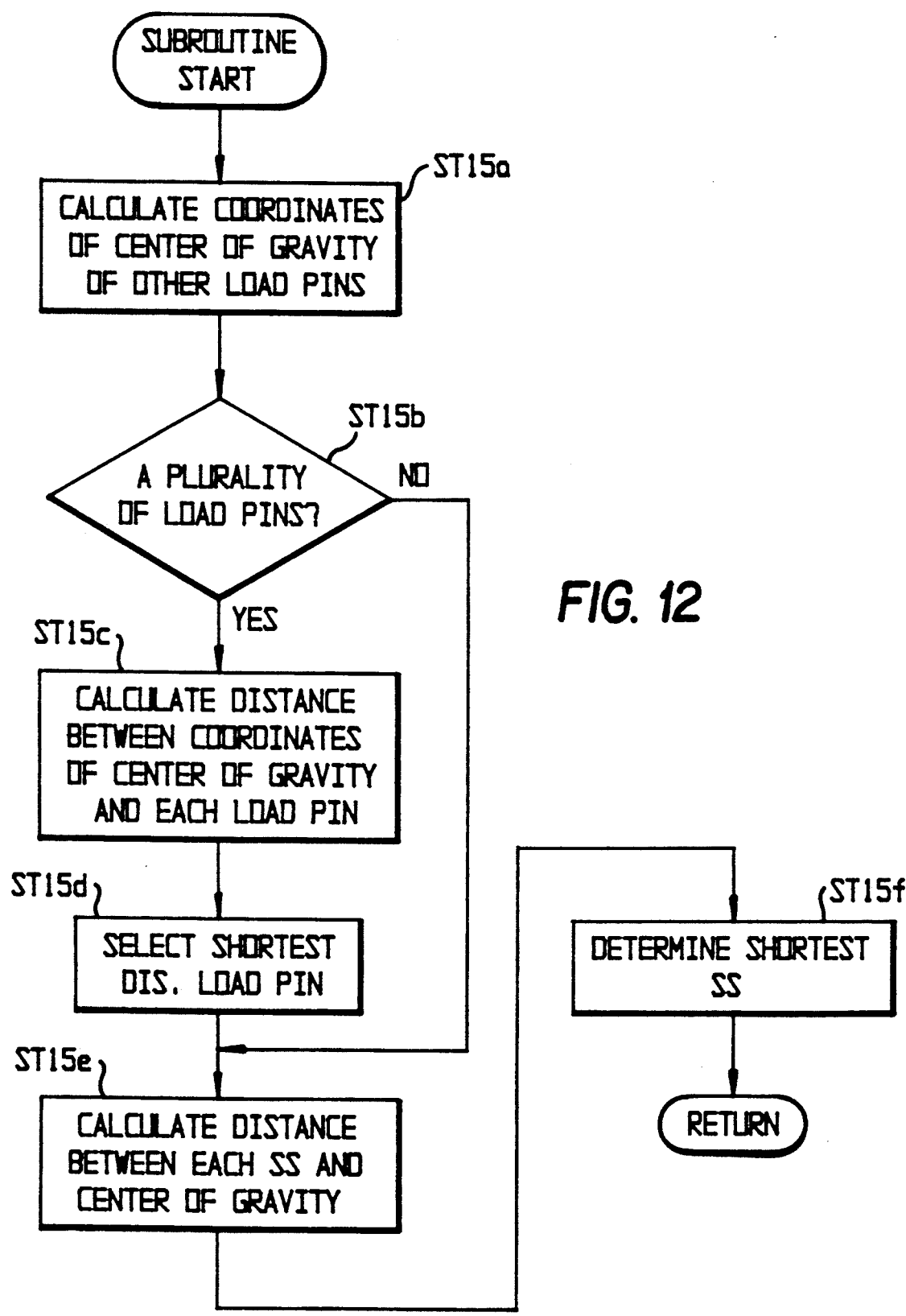
FIG. 12 is an operational flowchart of a subroutine of a step ST15 shown in FIG. 6.

When the CPU 23 selects the switching station SS12 and load pin L2 from the combinations derived in the step ST13 and the load pin L2 according to the subroutine of FIG. 12, the routine returns to a step ST16.

The subroutine of the step ST16 forms (extends) the path line in the same way as the subroutine of the step ST11, thus, from among the switching stations SS adjacent the load pin L2, SS20 is determined as meeting the requirements of the subroutine and is added to the current path between SS12 and L2. The contents of the subroutine of step ST16 are shown in the subroutine processing of FIG. 10.

As the result of the series of processings described above, the line from SS12–SS20—load pin L2 is formed, as shown in FIG. 7 (C).

Next, the routine goes to a step ST17 in which the CPU 23 determines whether the number of unwired load pins is 1. If more than 1 unwired load pin is present, the CPU 23 continues the series of processings, returning to the step ST12 of the main routine.

In the case of FIG. 7 (C), the number of unwired load pins are four, i.e., L3 through L6. Hence, the series of processings is continued, the routine returns to the step ST12 and is continued, through the forming step ST16, and the the line is formed up to the load pin L4 as shown in FIG. 7 (D), bringing the routine again to ST17. The processing is further continued returning again from the step ST7 to the step ST17, completing the line up to the load pin L6 is formed as shown in FIG. 7 (E).

Next, the line up to the load pin L5 is formed as shown in FIG. 7 (F). At this time, since only one unwired load pin remains, i.e. L3, the routine advances from the step ST17 to a step ST18. The CPU 23 calculates the distances from the SSs present along the extended connection line to the unwired load pin L3 and selects one of the switching stations SS the shortest distance from the remaining load pin via the program calculations. The switching station SS is, in this case, SS1, as appreciated from FIG. 7 (G).

Then, the routine goes to a step ST19 in which forming (extension) of the line between the SS1 and load pin L3 is executed.

In the step ST19, the CPU 23 executes the processing of subroutine shown in FIG. 10 in the same way as the steps ST11 and ST16. Consequently, as shown in FIG. 7 (G), the wired line from the SS1 to the load pin L3 is extended and a wired line network starting from the source pin S is completed.

The line network thus formed gives the shortest distances from the source pin to each load pin via the switching stations. Since the distances from the source pin to each load pin are short and delay time generated on the lines can be suppressed at minimum, circuit characteristics of the internal semiconductor integrated circuits can be improved.

In the first preferred embodiment, in the case where a plurality of SSs have a shortest distance to a single unwired load pin, a suitable control rule needs to be previously stored into the Data Base 21 so that any one of the SS can preferably be selected by the CPU 23. For example, any one of the SSs nearer to the barycentric position of all load pins may be selected.

(Second Preferred Embodiment)

Next, a second preferred embodiment of the system for automatically and optimally determining paths to be wired between circuit blocks of PLD will be described with reference to FIGS. 13 (A) to 17.

It is noted that the system configuration of the second preferred embodiment is substantially the same as that in the first preferred embodiment, i.e., that shown in FIG. 5.

The RAM 24 is provided with a storage area corresponding to each transistor incorporated within all switching stations. When the corresponding transistor is to be turned on to form a future actual path, a "1" can be set in the corresponding storage area. When the transistor is not to be turned on, "0" can be set in the storage area. For example, it is necessary to turn on a transistor TW1E1 (shown in FIG. 4 (A)) in the switching station SS3 of FIG. 1 for wiring a route from pin W1 to pin E1 in order to realize a rough path R1, At this time, "1" is set in the storage area of the RAM 24 corresponding to the transistor TW1E1 in the switching station SS3.

In the second preferred embodiment, if a switching station which cannot form a part of a virtual, or roughly determined, line of connection (a problematic SS) along a path being derived by the CPU 23 is present along the route of a rough wiring determination which determines a shortest distance from a given source pin (one circuit block) to any one of the load pins (one of the other circuit blocks to be interconnected), according to the second embodiment, the path is corrected such that the shortest derivable path is formed, if such correction is possible.

It is noted that such a switching station as described above is hereinafter called a problematic switching station and the term rough path determination has been described in the Background of the art.

FIGS. 13 (A) and 13 (B) show integrally a program flowchart stored in a ROM (Read Only Memory) 26 shown in FIG. 5 and executed by the CPU 23 in the second preferred embodiment.

Figure 1:
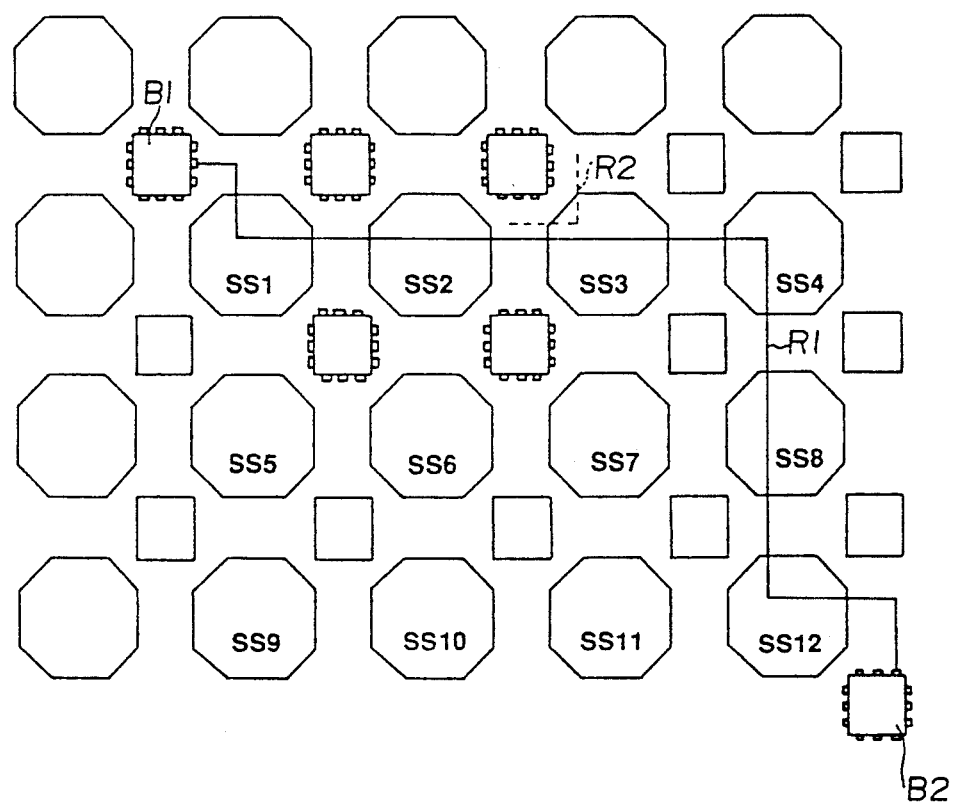
FIG. 1 is a schematic view of a structural example of Programmable Logic Devices (PLDs).
Figure 2:
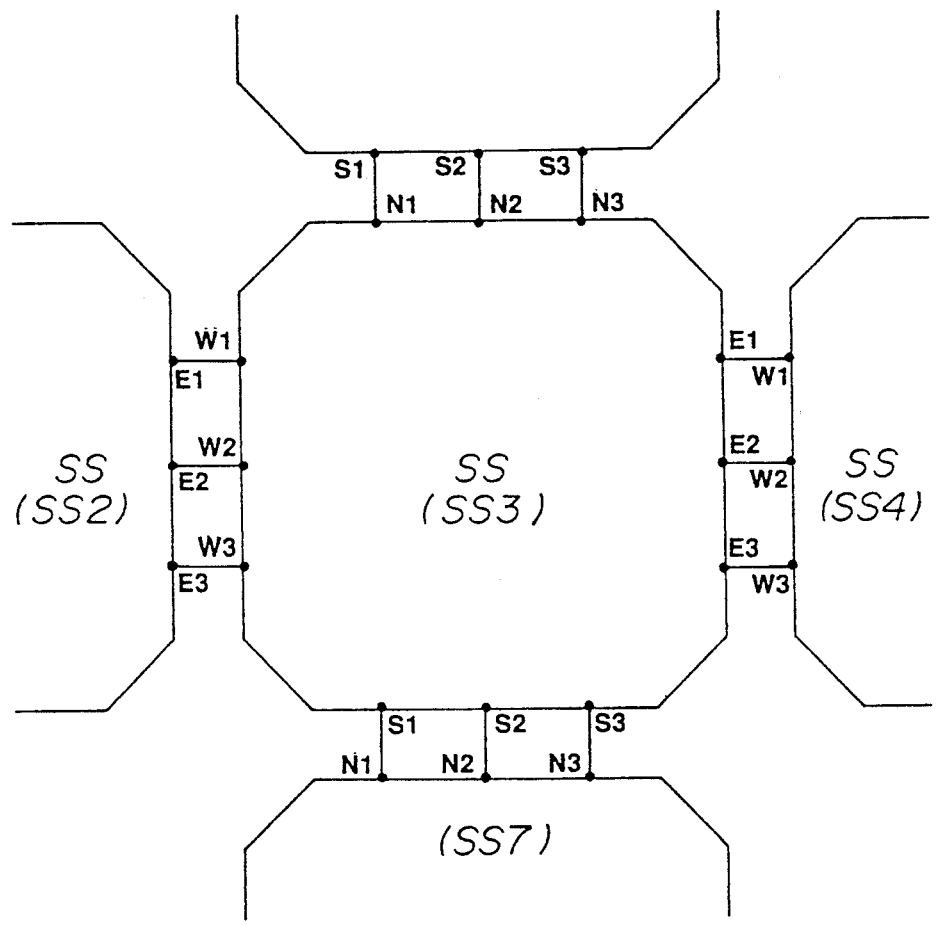
FIG. 2 is an enlarged top view of a representative switching station shown in FIG. 1 for explaining connections to adjacent switching stations.
Figure 3:
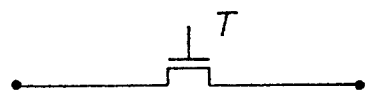
FIG. 3 is a schematic view of a MOS transistor interposed between electrically conductive pins of one switching station and an adjacent switching station.

It is noted that the program flowchart shown in FIGS. 13 (A) and 13 (B) is concerned with the correction of the roughly determined path R1 shown in FIG. 1.

When the circuit blocks to be interconnected are specified via the CPU 23, the CPU 23 carries out arithmetic operations to form the roughly determined path denoted by R1 of FIG. 1 between the circuit blocks to be interconnected and the result of the calculation data to form the path R1 is written into a predetermined area of the RAM 24, and the roughly determined path R1 is displayed on, e.g., the screen of the CRT 25 (Display Unit).

This calculation by the CPU 23 to form the path R1 includes: calculations to selectively determine through which of the switching stations the path R1 is to be passed in order to form a line of connection having a shortest path between the interconnected circuit blocks; calculations to determine which of the transistors incorporated into the selected SS is to be turned on in order to realize the derived path R1 in the switching station; and calculations to display the path passing the selected switching station on the CRT screen.

Then, the positional data on the roughly determined path and on the switching stations which have been selected to wire between the circuit blocks to be interconnected are temporarily stored into the RAM 25.

The roughly determined path is displayed on the screen substantially simultaneously with the processing referred to above.

Referring to FIG. 1, the positional data of the route R1 and each switching station over the route R1 (SS1–SS2–SS3–SS4–SS8–SS12) are stored in the RAM 24. The image substantially as shown in FIG. 1 is specifically displayed on the CRT screen.

In a step SP1 of FIG. 13 (A), the CPU 23 reads the positional data on the switching stations (SSs) related to the route of path R1 stored during the rough path determination process from the RAM 24.

In a step SP2, the CPU determines between which of pins extended on the relevant SSs are to be wired to each other within each switching station in order to realize a shortest path along the above-described route and reads the positional data thereon.

Referring to SS3 of FIG. 1, (in the example of FIG. 1) in order to form the path along the roughly determined path R1, a plurality of pairs of pins, i.e., (W1, E1), (W2, E2), and (W3, E3) are selected and the positional data on each of the related pins (W1, E1, W2, E2, W3, and E3) are read from the RAM 24.

In the next step SP3, the CPU 23 determines whether it is possible to wire directly between the W side and the E side for each switching station placed along the roughly determined path R1.

Specifically, when the CPU 23 determines that another line has previously been extended to at least one of either W1 or E1, and, another line has also been is extended to at least one of either W2 or E2, and at least one of either W3 or E3, a direct path between W side and E side cannot be formed. In this case, such a switching station as described above cannot form a part of a path (R1) derived by the CPU 23, this is called a problematic switching station and the CPU 23 searches for such problematic switching stations along the roughly determined path.

Figure 14:
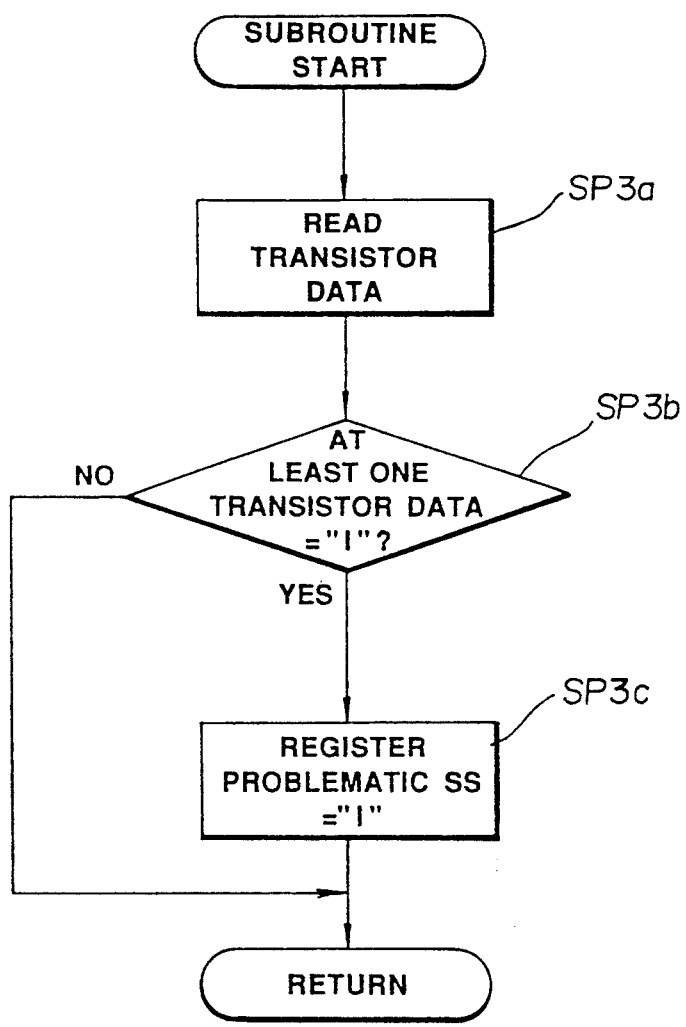
FIG. 14 is an operational flowchart of a subroutine of a step SP3 shown in FIGS. 13 (A) and 13 (B).
Figure 15A:
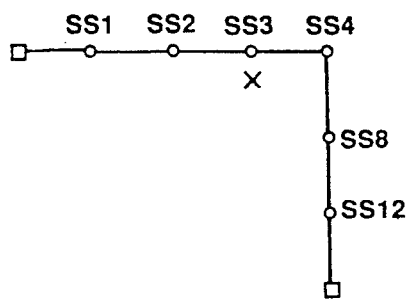
FIG. 15 (A), 15(B), 15(C), 15(D), 15(E), 15(F), 15(G), and 15 (H) are schematic views of displayed images on the CRT screen shown in FIG. 5 representing a plurality of patterns of paths passing and bypassing a problematic switching station applicable to the second preferred embodiment.
Figure 15B:
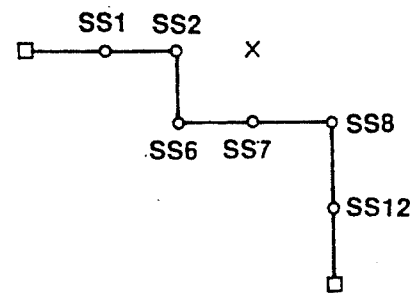
Figure 15C:
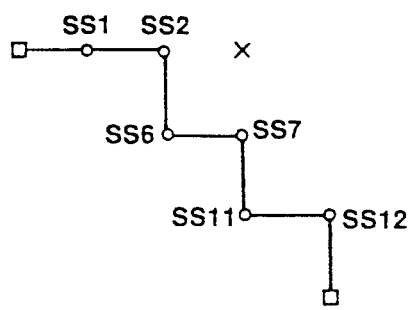
Figure 15D:
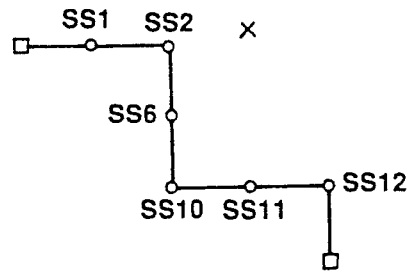
Figure 15E:
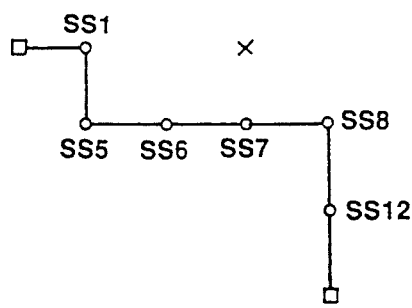
Figure 15F:
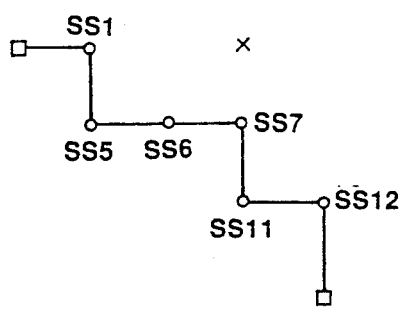
Figure 15G:
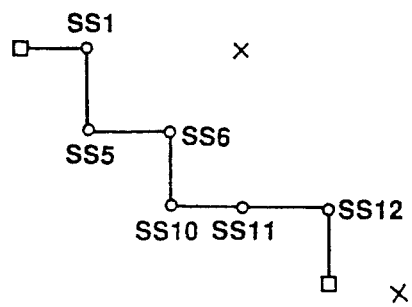
Figure 15H:
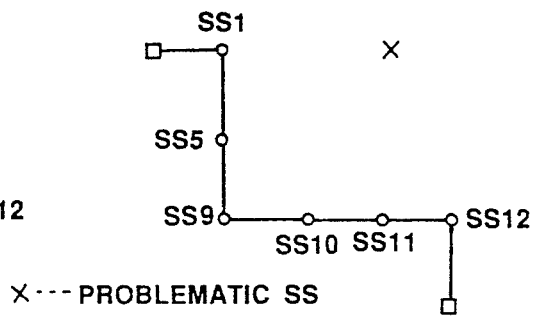

The search processing for problematic switching stations in the step SP3 is executed in accordance with a subroutine shown in FIG. 14.

That is to say, in the example of SS3 of FIG. 1, the CPU 23, in a step SP3a, reads data (1 or 0) corresponding to the status of the transistor TW1E1 to connect pin W1 to pin E1, the transistor TW2E2 to connect pin W2 to pin E2, and the transistor TW3E3 to connect W3 to E3 are read from the RAM 24.

In a step SP3b, the CPU 23 determines whether the status of all three transistors TW1E1, TW2E2, and TW3E3 indicate "1".

Since, in the example the result of determination in the step SP3b indicates all "1s" (YES) and the shortest path along the path R1 cannot be formed within the searched switching stations, switching station SS3 is defined as a problematic switching station, a bit data of "1" indicating that this is a problematic switching station is stored into the RAM 24 in a step SP3c and the subroutine is returned to the main routine.

On the other hand, if the CPU 23 determines that at least one of the data indicates "0" (i.e., all data do not indicate "1" (NO), the CPU determines that this is not a problematic SS and the routine returns to the main routine without engaging the step SP3c.

In a step SP4, the CPU 23 determines whether the search processing of the step SP3 has been executed for all switching stations present along the route R1. If (NO) in the step SP4, search processing is continued until the last switching station has been checked. In the example of FIG. 1, the searched SSs are SS1, SS2, SS3, SS4, SS8, and SS12, In a step SP5, the CPU 23 determines whether any problematic switching station is present. That is to say, the CPU 23 determines whether a switching station registering "1" in the step SP3c is present.

If the CPU 23 determines that a switching station registering "1" is not present, the CPU 23 determines that no problematic switching stations are present in the path R1 and processing of the program for the first correction of the roughly determined path R1 is ended.

Thereafter, "1" is written into a predetermined storage area of the RAM 23 corresponding to a suitable transistor, to be turned on when the line along the path R1 is actually prepared within the switching station and the routine is, then, transferred to a subsequent rough determination of a path or a main path. (It is noted that the definition of the rough determination of path and main determination of path has already been defined in the Background of the art). For example, "1" is set into the storage area of the RAM 24 corresponding to a suitable one of the transistors TE1N1, TE2N2, or TE3N3 (refer to FIGS. 4 (G), 4 (H), and 4 (I)) in the switching station SS2 of FIG. 1, in the case of the example of FIG. 1.

On the other hand, if the CPU 23 determines that at least one problematic switching station is present in the step SP5 (YES), the correction of the roughly determined path (R1) is executed after the subsequent steps.

In detail, the CPU 23 searches for another switching station through which another line, bypassing the problematic SS, can be formed, lines representing the alternate path to the circuit block are connected in a stepwise pattern.

For example, suppose that the problematic switching station is SS3 of FIG. 1. The CPU 23, then, searches for a new route of path bypassing the problematic SS, i.e., SS3.

Therefore, in a step SP6, the CPU 23 calculates to search for a new path bypassing the problematic switching station SS3 in a stepwise search pattern giving priority to the shortest possible alternate path to the target circuit block.

Various stepwise patterns of paths having the shortest paths are exemplified by FIG. 15 (A) (the normal path pattern along R1) through FIG. 15 (H).

The CPU 23 writes positional data on the bypass route patterns into the RAM 24, respectively.

The Data Base 21 sets a priority order on the bypass processings executed in the step SP6, a first priority given to a route bypassing the problematic switching station by diverting one SS upstream of the problematic SS (FIG. 15 (B), 15 (C) and 15 (D); upstream is to the left), a second priority given to a pattern diverting two adjacent SSs upstream (FIG. 15 (E), 15 (F)) before the problematic SS, a third priority being given to a pattern diverting two SSs upstream and two SSs below the problematic SS (FIG. 15 (G) and 15 (H)), and so on. The positional data of the bypassing patterns shown in FIGS. 15 (B) through 15 (H) are sequentially stored into the RAM 24 according to the priority order.

The reason that correction such that the new route is provided to bypass the first roughly determined path (R1) is in a stepwise form is that the corrected new path also gives the shortest path to the other circuit block (B2) in the same way as the original path (R1) before the correction (same total number of SSs).

The CPU 23 reads, at first, the positional data of the first bypass pattern shown in FIG. 15 (B) according to the priority order given to the plurality of patterns of routes and displays the bypass pattern (FIG. 15 (B)) on the screen of the CRT 25 in a step SP7.

Next, the routine is transferred to a step SP8 in which the CPU 23 searches for problematic SSs present along the bypass pattern read in the step SP7 in the same way as the subroutine executed in the step SP3.

Then, in a step SP9, the CPU 23 determines whether any problematic switching stations are in the bypass pattern read in the step SP7. If no problematic switching station is present in the step SP9, the CPU 23 determines that the bypass pattern read in the step SP7 is the corrected route to be extended to the target circuit block (B2) and the program is ended.

If, in the step SP9, the CPU 23 determines that a problematic switching station (registering "1") is present in the bypass route, the routine ends the search for problematic SSs along the bypass route read in the step SP7 and the routine goes to a step SP10. In the step SP10, the CPU 23 determines whether search processing for problematic SSs has ended for all bypass routes. When the CPU 23 determines that the search processings of the problematic SS for all bypass patterns are not complete, the routine returns to the step SP7 in which the CPU reads the other bypass pattern according to the priority order.

Then, the processing of steps SP8 and SP9 are executed until all bypass patterns are checked.

Referring to FIGS. 15 (A) through 15 (H), each bypass pattern is read and searched in the priority order, i.e, (B), (C), —, and (H). As described above, the program is ended when a route with no problematic SSs is found.

On the other hand, if a problematic SS is present along all bypass routes (FIG. 15 (A) through (H)) the routine goes to a step SP11 in which a different correction processing is executed for forming a path as will be described later.

That is to say, in the processing after the step SP11, the CPU 23 is operated to correct the roughly determined path of path (R1), forming a new path bypassing the line (R1) at a point at which it crosses from pins at the W side to those at the E side of the problematic switching station, (i.e., SS3) to correct the roughly path (R1) to a new path line (route).

Figure 16:
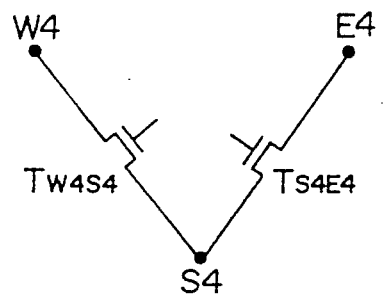
FIG. 16 is a schematic view indicating a specification of a bypass circuit within a problematic switching station applicable to the second preferred embodiment.

In general, according to the requirements of relieving path congestions within the switching station, each switching station is provided with a new route of path in addition to the direct routes from pins at W side to those at E side, the new route, as shown in FIG. 16, being extended from a pin (W4) at W side to a pin (E4) at E side via a pin (S4) at S side, this routing however provides a low level of routing freedom.

It becomes, therefore, possible to correct the roughly determined path R1 by forming a new route in the problematic SS utilizing the above described path as shown in FIG. 16. In this case, since a bypass route is formed only within the problematic switching station, extension of the path length to the target circuit block can be held to a minimum.

In a step SP11, the CPU 23 calls the problematic switching station present in the first roughly determined path R1 (the CPU 23 can recognize the problematic SS from the data bit "1" registered in step SP3c of the subroutine processing). Then, the CPU 23 reads the data corresponding to each transistor present in the problematic switching station from the RAM 24.

Since, in this example, the problematic switching station in the R1 is SS3, the data corresponding to each transistor placed within SS3 is read from the RAM 24.

Then, the routine goes to a step SP12 in which the CPU 23 determines whether at least one data indicating "1" is present from among the plurality of data relating to, e.g., transistors TW4S4 and TS4E4 (refer to FIG. 16), both transistors determining the new bypass route of path within the problematic SS, i.e., SS3.

In a case where the data for both of the above-described transistors TW4S4 and TS4E4 indicates "0", it is possible to form the new bypass route within the problematic switching station (SS3). Therefore, "1s" are written into the storage areas corresponding to the transistors TW4S4 and TS4E4 forming the new bypass route within the problematic switching station SS3 and the program is, then, ended.

On the other hand, if at least one of the data on the transistors TW4S4 and TS4E4 is determined to indicate "1", it is impossible to form the new bypass route within the problematic switching station of the currently selected bypass route. Therefore, the routine moves on to step SP13.

In a step SP13, the CPU 23 reads the bypass pattern for the next route registered in the step SP6 and selects bypass routes according to the priority order shown in FIGS. 15 (B) through 15 (H).

In a step SP14, the CPU 23 determines whether, for the currently selected route, it is possible to wire the new bypass route within the problematic switching station in the same way as the step SP12. When the new bypass route of path within the problematic switching station can be formed (YES), "1" is written into the storage area of the RAM 26 corresponding to the transistors which form the new bypass route within the switching station SS and the program is ended.

On the other hand if it is impossible to form the new bypass route within the problematic switching station for the currently selected bypass pattern, the routine goes to a step SP15. In the step SP15, the CPU 23 determines whether correction processing has been executed for all of the bypass routes according to the priority order, if NO, the routine returns to steps SP13 and SP14 until a suitable route is found or the problematic SSs have been checked for all bypass routes.

If YES in the step SP15, the routine proceed to a step SP16 and the CPU determines that a new bypass route is not possible in any of the problematic switching stations for all bypass routes shown in FIG. 15 (A) through 15 (H). Therefore, the CPU 23 further carries out another correction processing different from that described above.

The further correction processing executed is such as to correct the roughly determined path (R1) so that the route is diverted to one of the switching stations located adjacent to the problematic switching station.

Figure 17:
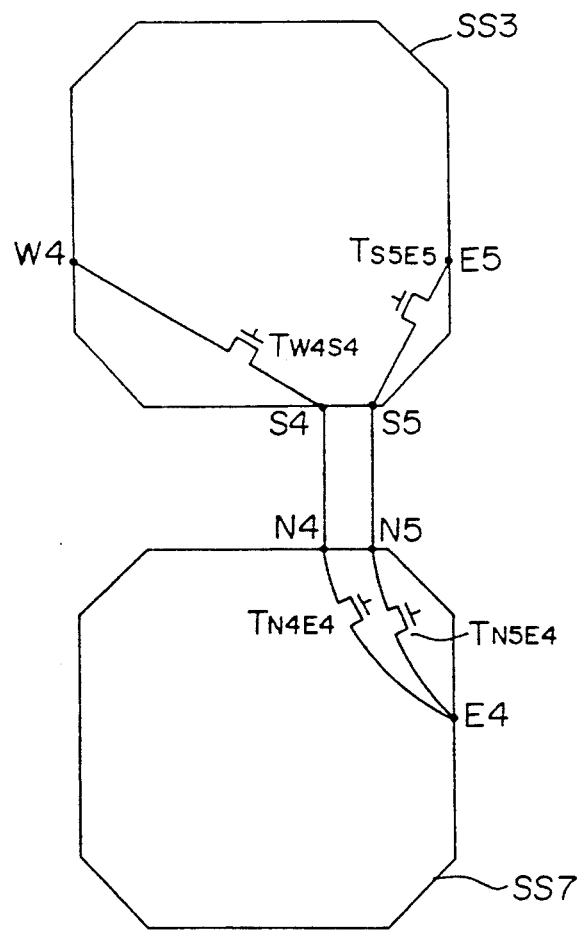
FIG. 17 is a system configuration for forming an alternative bypass circuit passing through two switching stations applicable to the second preferred embodiment.

As shown in FIG. 17, all of the switching stations are provided with a route passing from pin E4 to pin N5, therefore it is possible to alternatively correct the roughly determined path utilizing this other route. At this time, "1" is written into the storage areas of the RAM 24 corresponding to the appropriate transistors TW4S4 and TS5E5 (of SS3) and TN4E4 and TN5E4 (i.e. of SS7) in order to enable forming of an alternate route passing from pins W4–S4 (of SS3) to —N4—E4–N5 (of SS7) to —S5–E5 (of SS3).

In a step SP16, the CPU 23 reads the data on the transistors incorporated into SS3 and SS7 adjacent to SS3, SS3 being the problematic switching station in the roughly determined path R1.

In a step SP 17, the CPU 23 determines whether at least one of the data corresponding to the status of transistors TN4E4 and TN5E4 of SS7 and transistors TW4S4 and TS5E4 of SS3 indicates "1".

If the result of determination in the step SP17 indicates that all data corresponding to the transistors described above are "0s", it is possible to correct the path R1 by diverting the route R1 through the adjacent switching station (SS7). Therefore, "1s" are written into the respective storage areas corresponding to the transistors described above and the program is ended.

On the other hand, if the result of determination in the step SP17 indicates that the date for at least one of the necessary transistors indicates "1", the routine goes to a step SP18 in which the next bypass pattern of the routes registered in the step SP6 is read. The CPU 23 selects the bypass patterns shown in FIGS. 15 (A) through 15 (H) in accordance with the priority order.

In the step SP19, the CPU 23 reads the problematic switching station for the bypass pattern thus selected and determines whether it is possible to form a bypass route through an the adjacent switching station in the same way as the processing in the steps SP16 and SP17.

If the bypass route via an adjacent switching station is possible in the step SP19, the CPU 23 writes the data "1" into the storage areas corresponding to the transistors present in the bypass route of the problematic SS and the adjacent SS and the program is ended.

On the other hand, if the bypass route via the adjacent SS cannot be formed (YES) in the step SP19, the routine goes to a step SP20 in which the CPU determines whether the bypass route via an adjacent SS has been checked for all the bypass patterns in the priority order. If NO, the routine returns to steps SP18 and SP19 until all bypass patterns have been checked.

If, in the step SP20, it is impossible to form a bypass route via an adjacent SS for all the bypass patterns shown in FIGS. 15 (B) through 15(H), correction of the roughly determined path (R1) is determined as finally impossible. Therefore, in a step SP21, the CPU 23 commands the display unit 25 to display, for example, 'correction impossible', and the program shown in FIGS. 13 (A) and 13 (B) is ended.

It is noted that the reason that the correction of roughly determined path (R1) is carried out such that search for a third priority bypass route is made via an adjacent switching station is that since the bypass route via the adjacent SS causes the whole route to become longer than that of the second priority bypass route which is kept within the problematic SS, it is desirable to assign the adjacent SS correction method at the lowest priority. In addition, the increase in the total length of path even after the third correction is still held to the shortest possible length since the bypass route after the third correction passes merely through the adjacent switching station and does not require major diversion of the route from the optimally established path, or optimally established bypass paths.

In the second preferred embodiment described above, the CPU 23 determines, in the steps SP18 through SP20, whether it is possible to form the bypass route via an adjacent switching station (SS7), and locates the adjacent SS at a position below the problematic switching station (SS3) as viewed from the screen of the display unit 25 (refer to FIG. 17).

Alternatively, the third correction processing may be carried out for a bypass route which locates the adjacent SS on any side of the problematic switching station.

Figure 4:
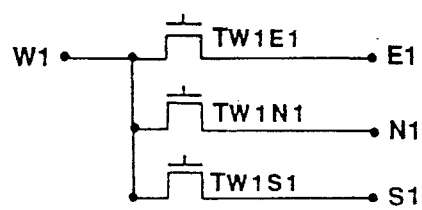
FIGS. 4 (A), 4(B), 4(C), 4(D), 4(E), 4(F), 4(G), 4(H), 4(I), 4(J), 4(K), 4(L), and 4(M) are schematic views of internal path specifications for respective switching stations shown in FIGS. 1 and 2.
Figure 4:
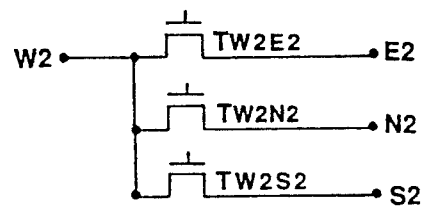
Figure 4:
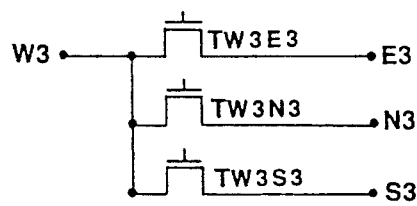
Figure 4:
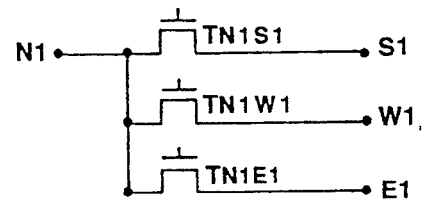
Figure 4:
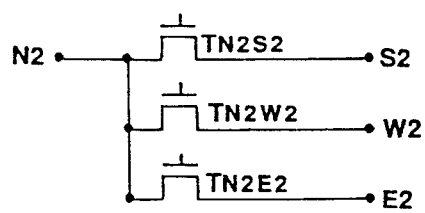
Figure 4:
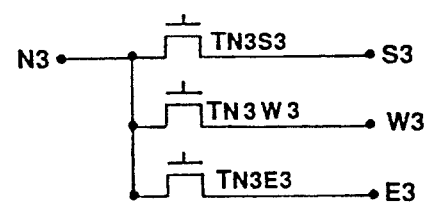
Figure 4G:
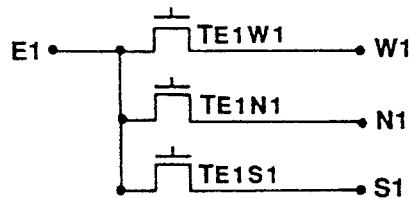
Figure 4H:
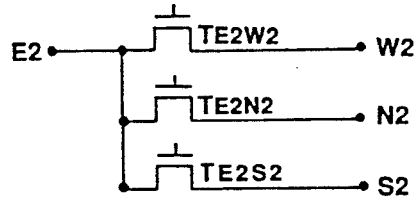
Figure 4I:
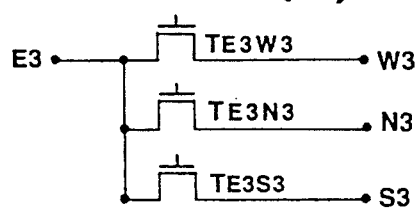
Figure 4J:
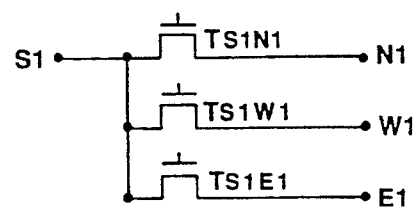
Figure 4K:
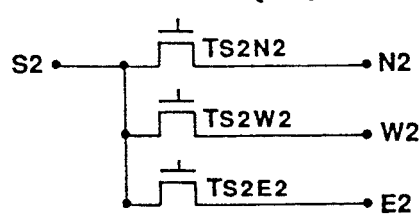
Figure 4L:
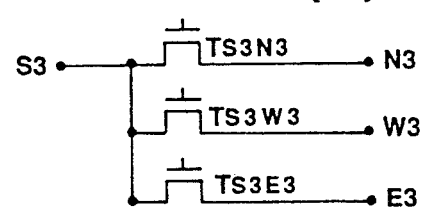
Figure 4M:
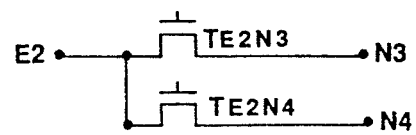

In addition, various transistor-and-pin arrangements other than those shown in FIGS. 4 (A) through 4 (M) and FIGS. 16 and 17 may be provided within each switching station SS according to the user's requirements.

While the present invention has been disclosed in terms of the preferred embodiment in order to facilitate better understanding thereof, it should be appreciated that the invention can be embodied in various ways without departing from the principle thereof. Therefore, the invention should be understood to include all possible embodiments and modifications to shown embodiments which can be embodied without departing from the principle of the invention as set out in the appended claims.

What is claimed is:

1. A method for automatically and optimally determining a route to be established in a large scale integrated circuit (LSI), said LSI comprising a) a plurality of circuit blocks, each circuit block having a plurality of terminal pins extended along respective sides thereof; b) a plurality of switching stations, each switching station having a plurality of terminal pins extended along respective sides thereof for providing connecting means between the respective pins so as to propagate the route, the method comprising:

defining a single source pin from any one terminal pin of one of the circuit blocks and a plurality of load pins defined from any other terminal pins of any other circuit blocks required to be connected to the source pin, wherein said method for automatically and optimally determining the route to be established in the LSI comprises the steps of:

selecting a first load pin to be established via a first path based on determining which of the load pins is a shortest distance from the source pin and, when a plurality of load pins are an equally short distance from the source pin, selecting the first load pin based on determining which of the load pins is a shortest distance form a first position on a first center of gravity determined relative to the plurality of load pins to be wired, said first center of gravity being determined excluding the load pins closest to the source pin;

forming a first path from the source pin to the first load pin, the first path including at least one switching station at a position which is a shortest distance both from the first load pin and from a second center of gravity determined from the positions of the unwired load pins excluding the first load pin;

selecting a second load pin to be wired second from among the plurality of load pins other than the first load pin based on determining which of the load pins other than the first load pin is a shortest distance from any one of the switching stations present on the first path;

forming a second path branched from the first path so as to extend the route, the second path including at least one switching station selected at a position which is a shortest distance from the second load pin and from a third center of gravity determined from the positions of the unwired load pins excluding the first and second load pins; and continuously forming a plurality of paths branched from the established first and second paths to complete a line network from the source pin to the plurality of load pins until all of the unwired load pins are wired to the line network via the switching stations adjacent to the respective load pins.

2. A system for automatically and optimally determining a route to be wired in a Programmable Logic Device (PLD), said PLD comprising a) a plurality of circuit blocks, each circuit block having a plurality of terminal pins extended along respective sides thereof; and b) a plurality of switching stations, each switching station having a plurality of terminal pins extended along respective sides thereof for providing connecting means between the respective pins so as to propagate the route, said system for automatically and optimally determining a route to be wired comprising:

means for selecting a single source pin from any one terminal pin of one of the circuit blocks and a plurality of load pins defined from any other terminal pins of any other circuit blocks required to be connected to the source pin;

first means for selecting a first load pin to be established via a first path based on determining which of the load pins is a shortest distance from the source pin, and when a plurality of load pins are an equally short distance from the source pin, selecting the first load pin based on determining which of the load pins is a shortest distance from a first position of a first center of gravity determined relative the plurality of load pins to be wired, said first center of gravity being determined excluding the load pins closest to the source pin;

second means for forming a first path from the source pin to the first load pin, the first path including at least one switching station at a position which is a shortest distance form the first load pin and from a second center of gravity determined from the positions of the unwired load pins excluding the first load pin;

third means for selecting a second load pin to be wired second from among the plurality of load pins other than the first load pin based on determining which of the load pins other than the first load pin is a shortest distance from any one of the switching stations present on the first path;

fourth means for forming a second path branched from the first path so as to extend the route, the second path including at least one switching station selected at a position which is a shortest distance from the second load pin and from a third center of gravity determined form the positions of the unwired load pins excluding the first and second load pins; and fifth means for continuously forming a plurality of paths branched form the established first and second paths to complete a line network extended from the source pin to the plurality of load pins until all of the unwired load pins are wired to the line network via the switching stations adjacent to the respective load pins.

3. A system as set forth in claim 2, wherein the first means includes: sixth means for receiving all positional data on the switching stations and source and load pins; seventh means for calculating distances from the source pin to the respective load pins and determining which of the load pins is the shortest distance from the source pin and, if a plurality of load pins are an equally short distance from the source pin, further calculating the distance of each load pin from the first position of the first center of gravity and determining which one of the plurality of load pins is the shortest distance from both the source pin and from the first position of the first center of gravity.

4. A system as set forth in claim 2, wherein the third means calculates the distance from each switching station to each load pin, excluding the first load pin, and determines which of the load pins, excluding the first load pin, is the shortest distance from each of the switching stations present on the first path.

5. A system as set forth in claim 2, wherein the fourth means includes: eighth means for calculating the distance from each switching station present on the first path to the second load pin and determining which of the switching stations is the shortest distance from the second load pin and, if a plurality of switching stations are an equally short distance from the second load pin, further calculating the distance of each switching station from the third center of gravity and determining which of the switching stations is the shortest distance both from the second load pin and from the third center of gravity; and ninth means for forming the second path from the switching station determined by said eighth means which serves as the branch to the second load pin via at least one switching station selected at a position which is a shortest distance both from the second load pin and from the third center of gravity.

* * * * *

UNITED STATES PATENT AND TRADEMARK OFFICE
CERTIFICATE OF CORRECTION

PATENT NO.   : 5,309,372
DATED        : May 3, 1994
INVENTOR(S)  : Tomohiro Marui; Hideyo Funatsu It is certified that error appears in the above-indentified patent and that said Letters Patent is hereby corrected as shown below:

Col. 7, line 31, change "Distance = $|X_L - X_S| + Y_L - Y_S$" to --Distance = $|X_L - X_S| + |Y_L - Y_S|$--.

Signed and Sealed this

Eighth Day of November, 1994

Attest:

BRUCE LEHMAN

*Attesting Officer*    *Commissioner of Patents and Trademarks*